United States Patent [19]

Welch et al.

[11] Patent Number: 5,193,098

[45] Date of Patent: Mar. 9, 1993

[54] METHOD OF FORMING CURRENT BARRIERS IN SEMICONDUCTOR LASERS

[75] Inventors: David F. Welch; Donald R. Scifres, both of San Jose; William Streifer, Palo Alto, all of Calif.

[73] Assignee: Spectra Diode Laboratories, Inc., San Jose, Calif.

[21] Appl. No.: 935,475

[22] Filed: Aug. 24, 1992

Related U.S. Application Data

[60] Continuation of Ser. No. 770,594, Oct. 3, 1991, abandoned, which is a division of Ser. No. 557,901, Jul. 25, 1990, which is a continuation-in-part of Ser. No. 303,754, Jan. 27, 1989, abandoned.

[51] Int. Cl.$^5$ .............................................. H01S 3/19
[52] U.S. Cl. .................................... 372/46; 372/44; 372/45; 372/50
[58] Field of Search .................. 372/46, 45, 50, 44

[56] References Cited

U.S. PATENT DOCUMENTS

| | | | |
|---|---|---|---|
| 3,936,322 | 2/1976 | Blum et al. | 148/1.5 |
| 4,532,700 | 8/1985 | Kinney et al. | 29/576 W |
| 4,577,397 | 3/1986 | Komatsu et al. | 29/576 B |
| 4,680,768 | 7/1987 | Yagi | 372/45 |
| 4,706,254 | 11/1987 | Nojiri et al. | 372/46 |
| 4,716,125 | 12/1987 | Makiuchi | 437/22 |
| 4,727,557 | 2/1988 | Burnham et al. | 372/46 |
| 4,731,789 | 3/1988 | Thornton | 372/45 |
| 4,750,183 | 6/1988 | Takahashi et al. | 372/45 |
| 4,783,425 | 11/1988 | Fukuzawa et al. | 437/46 |
| 4,815,084 | 3/1989 | Scifres et al. | 372/46 |
| 4,980,893 | 12/1990 | Thornton et al. | 372/50 |
| 4,987,468 | 1/1991 | Thornton | 372/46 |
| 5,031,185 | 7/1991 | Murakami et al. | 372/46 |

OTHER PUBLICATIONS

N. Bar-Chaim et al., "Be-implanted (GaAl)As stripe geometry lasers", *Applied Physics Letters*, vol. 36, No. 4, 15 Feb. 1980, pp. 233-235.

S. Ghandhi, *VLSI Fabrication Principles*, pp. 300-346, Wiley & Sons, 1986.

*Primary Examiner*—Georgia Y. Epps
*Attorney, Agent, or Firm*—Schneck & McHugh

[57] ABSTRACT

A method using implantation to form a semiconductor laser or laser array with current blocking implants. A semiconductor material laser structure including layers of a first conductivity type, an active region and layers of a second conductivity type is formed. In a first embodiment, impurity ions of the second conductivity type are implanted into selected regions of a first conductivity type layer. The implanted ions form current blocking buried regions of the second conductivity type with current confining channels therebetween. Finally, the structure is thermally annealed. In a second embodiment, a disorder inducing impurity, which may be a saturable absorber, is diffused into selected portions of the layers of the first conductivity type through the active region. The diffusion converts side regions of those layers into the second conductivity type. Impurity ions of the first conductivity type are implanted to a uniform depth crossing through the side regions to form a buried region of the first conductivity type. Current is confined to the center undiffused region. Last, the structure is thermally annealed. A laser array with individually addressable conductive contacts is also described. Ion bombardment is used to create insulative surface regions to isolate adjacent contacts from one another.

22 Claims, 5 Drawing Sheets

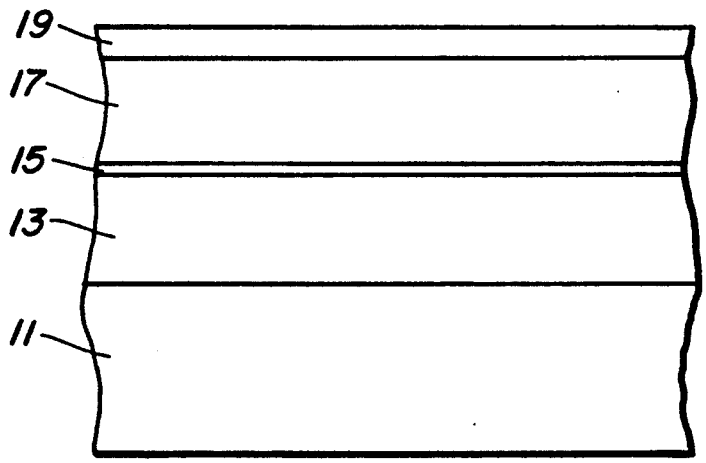
FIG._1.
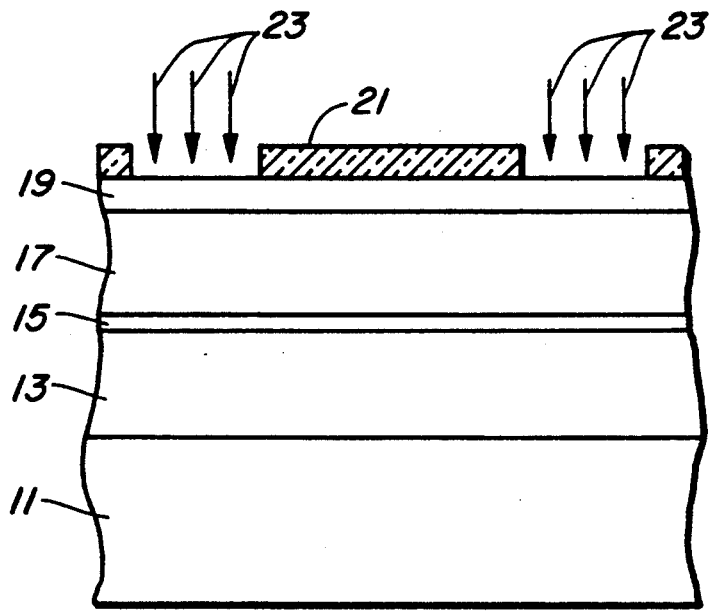
FIG._2.
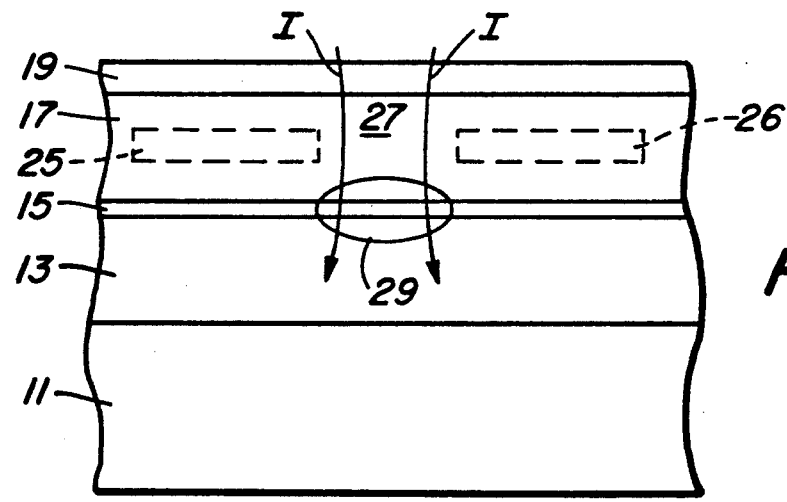
FIG._3.

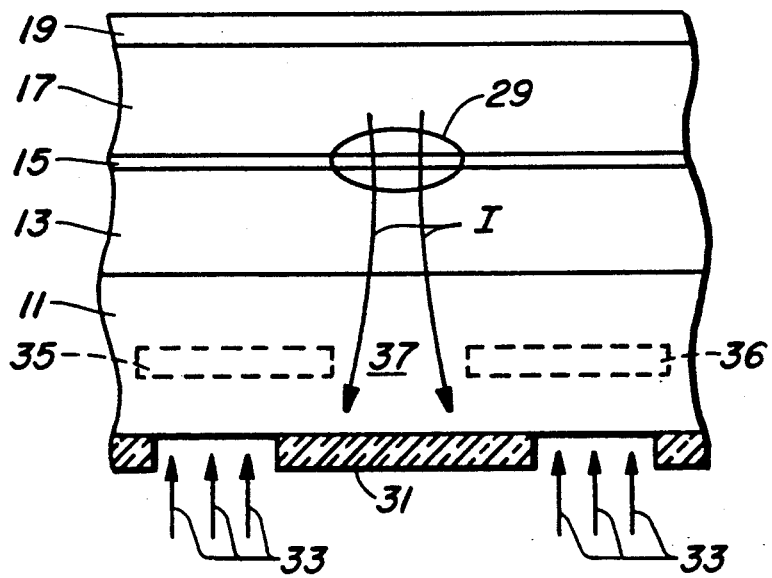
FIG._4.
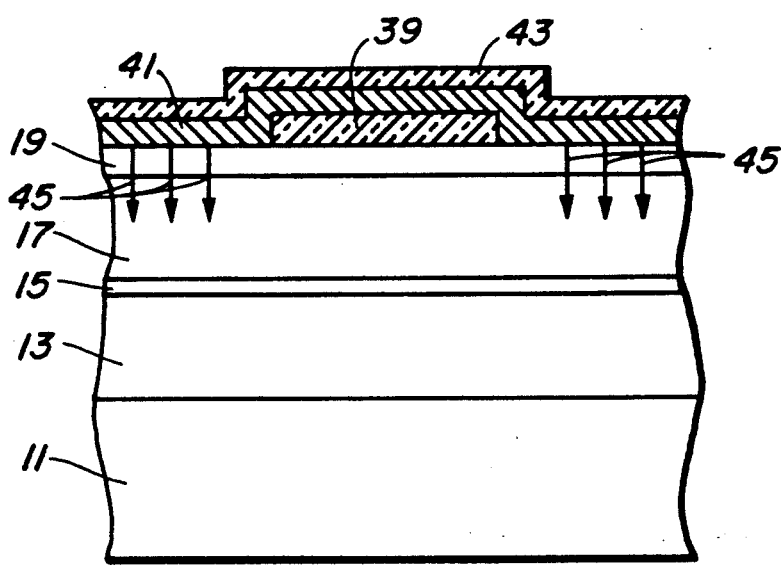
FIG._5.
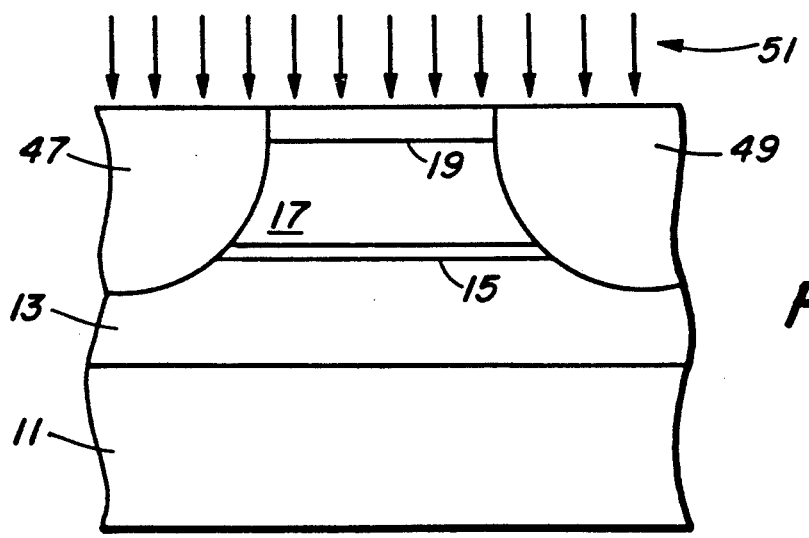
FIG._6.

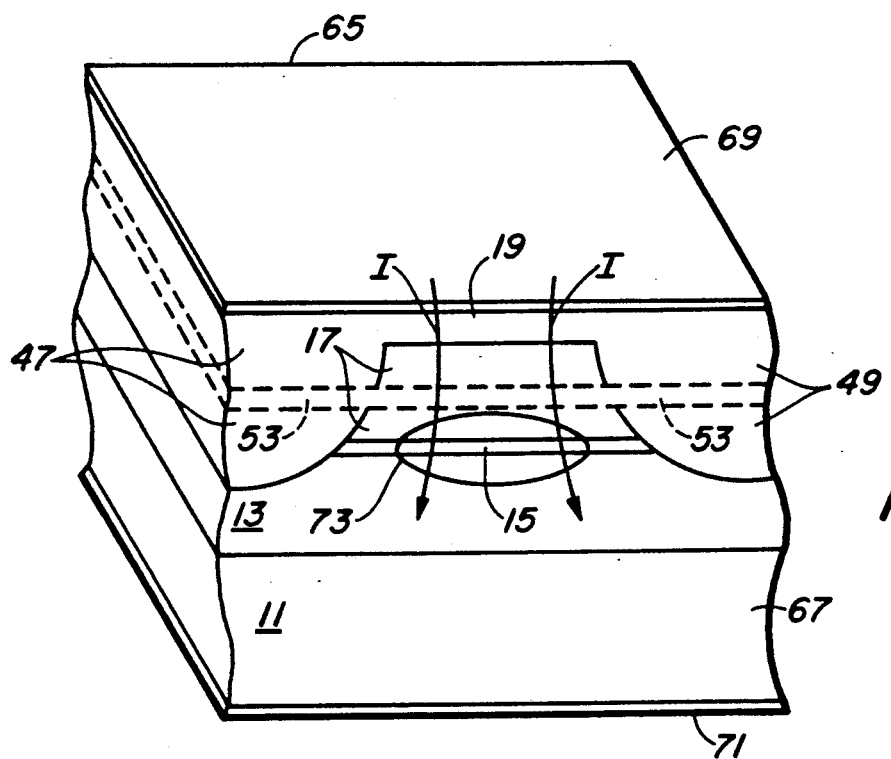
FIG._7.
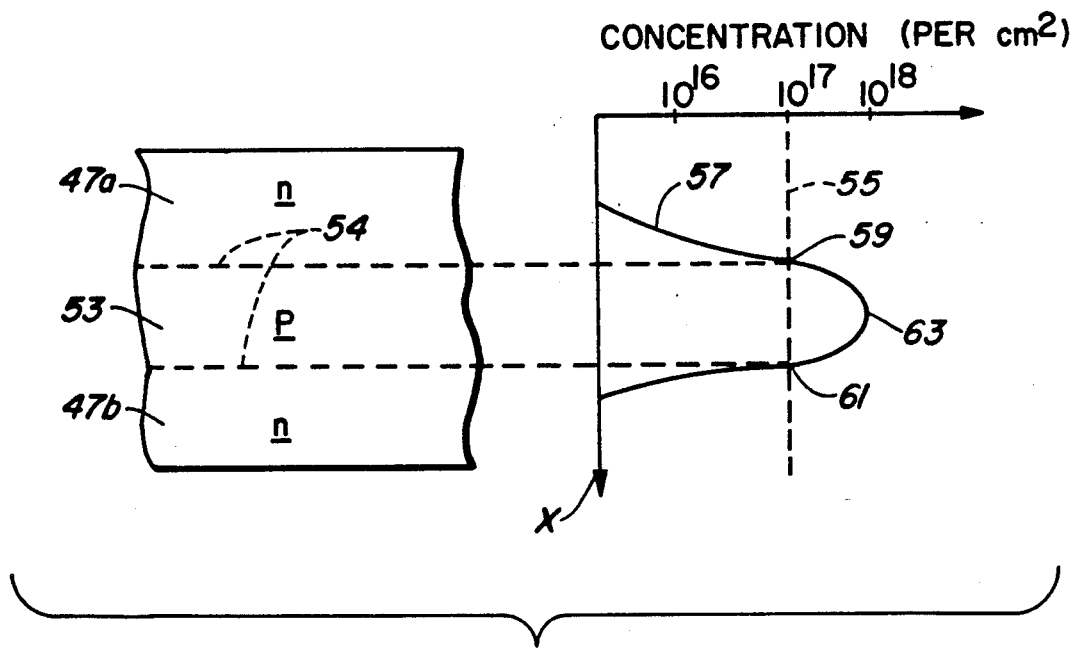
FIG._8.

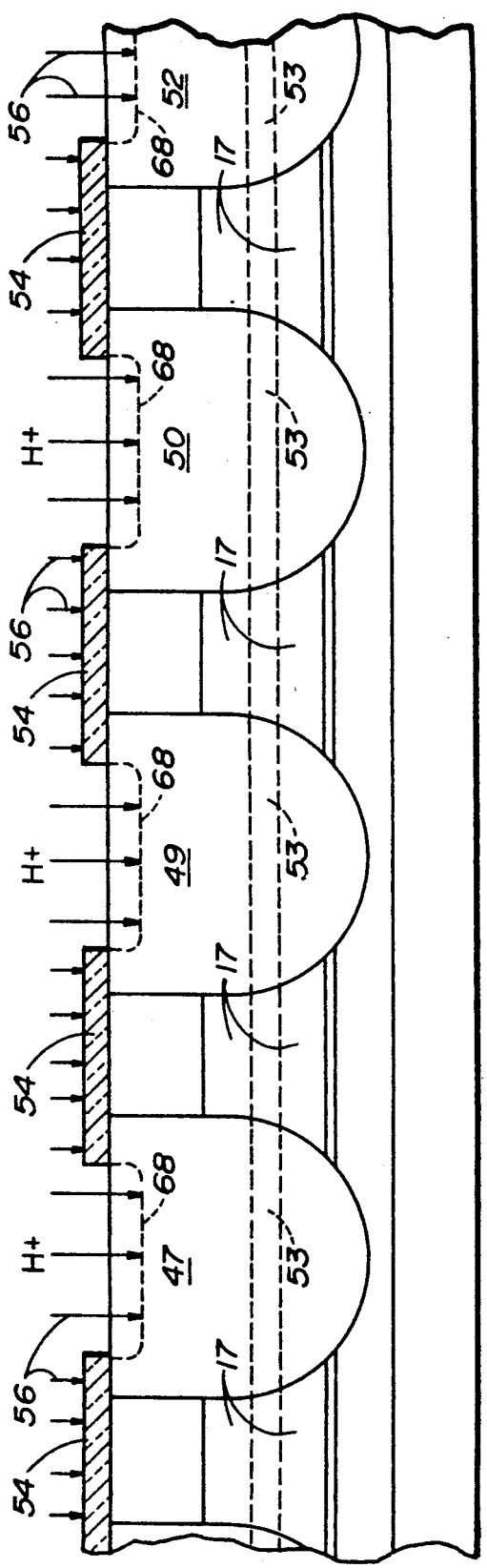
FIG._9
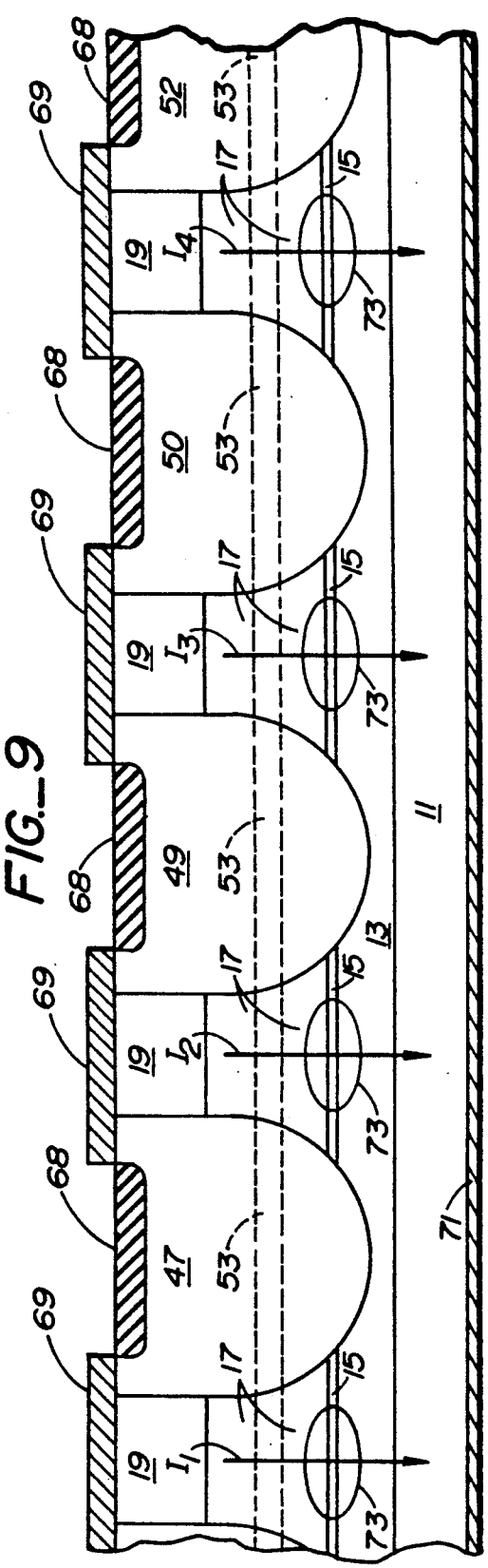
FIG._10

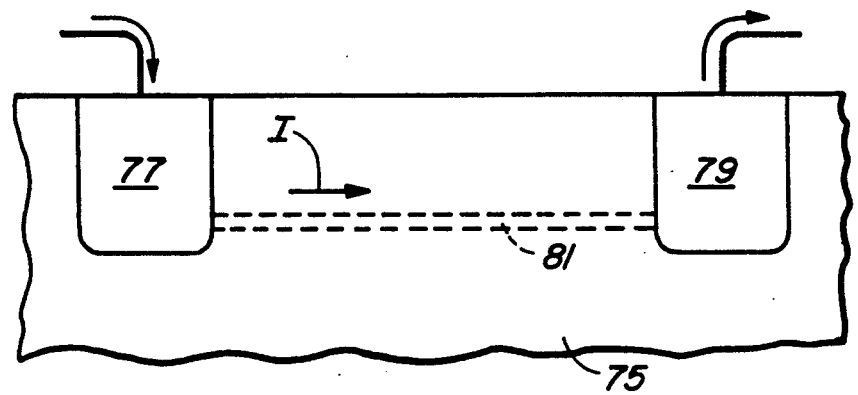
FIG._11.
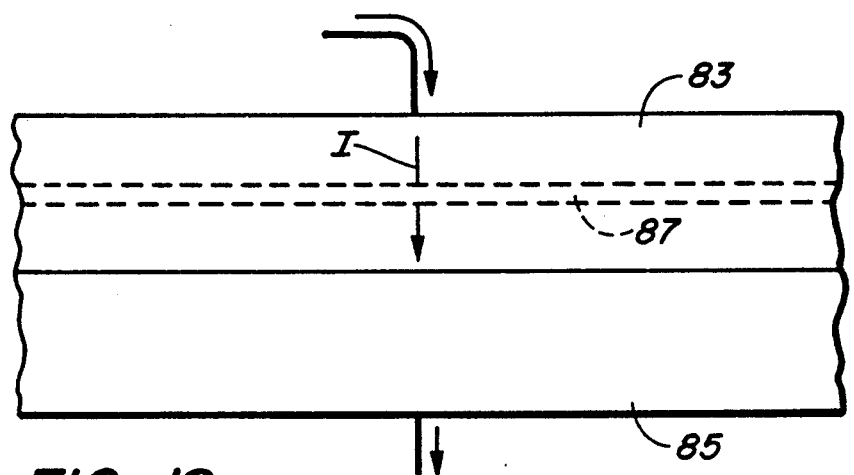
FIG._12.
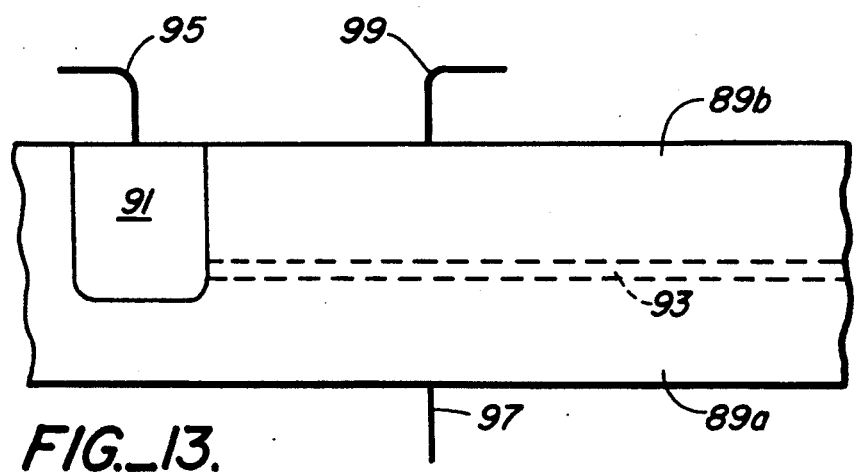
FIG._13.

METHOD OF FORMING CURRENT BARRIERS IN SEMICONDUCTOR LASERS

STATEMENT AS TO RIGHTS TO INVENTIONS MADE UNDER FEDERALLY-SPONSORED RESEARCH AND DEVELOPMENT

This invention was made with Government support under Contract No. F29601-87-C-0028 awarded by the Department of the Air Force. The Government has certain rights in this invention.

CROSS-REFERENCE TO RELATED APPLICATIONS

This is a continuation of copending application Ser. No. 07/770,594 filed on Oct. 3, 1991 now abandoned, which was a divisional of Ser. No. 557,901 filed on Jul. 25, 1990 which was a continuation-in-part of Ser. No. 303,754 filed on Jan. 27, 1989 now abandoned.

DESCRIPTION

1. Technical Field

The present invention relates to processes forming current control structures in semiconductor lasers and in particular to methods of forming structures of the type which have buried regions defining reverse biased junctions that block current flow wherever such regions are located.

2. Background Art

Current confinement structures are used in semiconductor lasers to provide low threshold and high efficiency. One typical structure is formed by growing an oxide surface layer, then, using mask technology, etching away selected portions of the oxide. The oxide material is insulative so current flows only into those areas of the underlying laser structure where the oxide layer has been removed. Another typical structure is formed by implanting protons into selected areas of the semiconductor laser surface. The protons damage the semiconductor crystal lattice making those areas insulative, just like the oxide layer.

In U.S. Pat. No. 3,936,322, Blum et al. describe a method where oxygen ions are implanted in regions on each side of the light emitting active region to make such implanted side areas semi-insulating or very highly resistive to electric current. The ions form electron traps which are effective at making the implanted regions semi-insulative when the oxygen density exceeds $10^{17}/cm^3$. Implantation damage can be removed by annealing at 600° C. for 30 minutes.

Several techniques use multiple growths to produce current blocking layers below the laser's surface so as to confine current to particular regions of the laser. For example, a p-type blocking layer can be grown on an n-type substrate and openings made in selected areas of the p-type blocking layer where current flow is desired. Next, an n-type cladding layer, active region, p-type cladding layer and p-type cap layer may be grown to complete the heterostructure. The reverse biased p-n junction between the n-type cladding layer and the p-type blocking layer has a higher turn-on voltage and higher threshold than the n-n interface between n-type cladding layer and n-type substrate in the areas opened in the blocking layer, so current is effectively confined.

In U.S. Pat. No. 4,783,425, Fukuzawa et al. describe a fabrication process for a laser heterostructure in which part of the p-AlGaAs upper cladding layer of the heterostructure is deposited, n-GaAs current confinement layer regions are formed on the cladding layer and the remainder of the p-AlGaAs upper cladding layer is deposited over the first cladding part and the confinement regions. The current confinement layer regions are formed either by an epitaxial layer deposition followed by a selective etch of the n-GaAs or by a selective epitaxial layer deposition of the n-GaAs, using a $SiO_2$ mask layer wherever deposition is unwanted. Since any exposed AlGaAs readily oxidizes, forming an unstable degradation layer, a thin undoped GaAs "protecting layer" is formed over the first part of the cladding layer prior to forming the current confinement layer regions. The thin protecting layer is later thermally interdiffused with the cladding material with the aid of disorder inducing zinc dopant in the overlying AlGaAs cladding material.

Other techniques use diffusion of n- or p-type dopants rather than etching to "open" up current blocking layers of opposite conductivity type. For example, a laser heterostructure comprising n-type substrate and cladding layers, an active region, and p-type cladding and cap layers may be grown with an n-type current blocking layer included either at the surface above the cap layer or below the surface between the cladding and cap layers or even dividing the p-type cladding layer in two. Next, a p-type dopant, such as zinc, is surface implanted in selected locations and thermally diffused downward through the n-type current blocking layer. The diffused dopant alters the conductivity type of the blocking layer in selected locations to p-type allowing current to flow through these locations but not through the unaltered areas of the blocking layer.

N. Bar-Chaim, et al. in "Be-Implanted (GaAl)As Stripe Geometry Lasers", Applied Physics Letters, vol. 36, no. 4, 15 Feb. 1980, pp. 233-235, describe another diffusion method for obtaining current confinement in which a GaAs/GaAlAs heterostructure is grown which is all n-type. Next, beryllium ions (a p-type dopant) are surface implanted in stripes. The wafer is then annealed for 40 minutes at 800° C. This results in diffusion of the implanted stripe down to the GaAs active region creating a p-n junction for active gain. The structure prevents current spreading around the stripe while limiting the gain region to the stripe width and to small minority-carrier current tails on either side of the stripe.

In U.S. Pat. No. 4,532,700, Kinney et al. describe a method for electrically isolating semiconductor structures in which a p-type silicon body is ion implanted with N-type ions to form N-type buried regions. N-type surface regions may also be formed. The N-type regions, under certain anodic etching conditions, etch slower than the surrounding silicon material. The structure is anodically etched to selectively convert all but the formed N-type regions into porous silicon, which is then converted into an electrically insulative, silicon dioxide dielectric by oxidation. The structure is finally annealed to densify the oxidized material.

Each of the known methods are complex and require many steps, such as growth, masking, photolithography, etching, mask removal, growth of next layer, etc. Further, some of the resulting barrier layer structures are not perfect barriers and allow some current leakage due to tunneling.

It is an object of the present invention to provide a simpler process of forming current blocking layers in a semiconductor laser or laser array, and a laser structure so formed.

DISCLOSURE OF THE INVENTION

The above object has been met with a process that includes ion implanting electrically active impurities, i.e. dopants, into a semiconductor material structure to form a buried barrier region with a reverse biased p-n junction for current confinement. Preferably, the structure is then annealed at high temperature to restore damage to the crystal lattice without causing substantial diffusion. In one embodiment, a semiconductor laser or laser array structure which has uniformly doped layers is selectively implanted to create one or more current channels. In another embodiment, a semiconductor laser structure first undergoes a selective diffusion for impurity induced disordering in portions of the active region. In this case, the material conductivity type of the surface layers is selectively changed by this diffusion. The diffused impurity may be a saturable absorber so as to provide longitudinal mode stabilization. After the diffusion, the laser structure is uniformly implanted with dopant of the original conductivity type of the surface layers to automatically create buried current barriers within the diffused areas and current channels in the undiffused areas. The impurity ions may also be implanted in multiple doses with different implantation energies in order to create more than one level of buried regions.

The laser created by this method is characterized by one or more buried regions formed by the implant step with dopant concentration profiles that are not constant throughout the buried regions but rather graded. The concentration versus depth profile is somewhat Gaussian in character, with a peak concentration occurring near the average implantation depth and the concentration falling off for greater and lesser depths. However, due to the many factors affecting ion penetration into a crystal lattice made up of layers of varying composition, the ion penetration depth and resulting concentration profile is unlikely to be exactly Gaussian.

A laser array with individually addressable conductive contacts for current injection into the active regions can be formed. Ion bombardment is used to create insulative surface regions between spaced apart contacts on one laser surface.

One advantageous effect of the concentration profile is that the buried regions do not have abrupt junction boundaries, in which the concentration of implanted impurity ions suddenly drops to zero outside of the buried regions. Instead, the junctions of the buried regions with the material layers in which they are implanted are characterized by an impurity concentration gradient, where the concentration of implanted impurity ions is higher than the original dopant concentration within the buried region, falls off gradually until the concentrations are equal at the junction boundary and the implanted impurity concentration lower than the original dopant concentration in the semiconductor layers outside of the buried regions. This concentration gradient has been found to produce the unexpected advantage of less leakage current through the barriers due to tunneling effects than the abrupt boundaries created by grown current blocking layers. Other advantages, such as ease of manufacture and the like, will be seen in the following description of the best mode.

BRIEF DESCRIPTION OF THE DRAWINGS

FIG. 1 is a front end view of a starting laser structure in the method of the present invention.

FIG. 2 is a front end view of a laser structure illustrating an implantation step of a first embodiment of the method of the present invention.

FIG. 3 is a front end view of a first completed laser structure with, implanted current barriers made by the first embodiment of the method of the present invention.

FIG. 4 is a front end view of a laser structure illustrating an alternative method of the present invention.

FIGS. 5 and 6 are front end views of a laser structure illustrating steps of a third and preferred embodiment of the method of the present invention.

FIG. 7 is a perspective view of a completed laser structure with implanted current barriers made by the third embodiment of the method of the present invention.

FIG. 8 is an end view of a portion of the laser structure of FIG. 7, including an implanted current barrier, together with a corresponding graph of impurity concentration versus depth.

FIGS. 9 and 10 are front end views of a laser array structure illustrating steps continuing from FIG. 6 of a fourth embodiment of the method of the present invention.

FIGS. 11-13 are side elevational views of alternative semiconductor devices produced by the method of the present invention.

BEST MODE FOR CARRYING OUT THE INVENTION

With reference to FIG. 1, a semiconductor laser structure is formed comprising a semiconductor material substrate 11 and a plurality of layers 13, 15, 17 and 19 of semiconductor material successively deposited onto substrate 11. The laser structure may be fabricated on a wafer substrate by metal-organic chemical vapor deposition, liquid phase epitaxy, molecular beam epitaxy or other known crystal growth processes. Layer interfaces need not be planar, as shown here, but can also include structures known in the art that provide lateral real-refractive-index waveguiding, such as buried heterostructure waveguides, channeled-substrate-planar waveguides, mesa substrate index waveguides, ridge waveguides, rib waveguides, etc. Such waveguide structures may be formed using etching, diffusion, selective growth and other known techniques.

While the following discussion and corresponding drawings will be principally directed to a single laser emitter, the method can be extended to form multiple emitters in a monolithically-integrated laser diode array. One method of constructing an individually addressable laser diode array will be discussed below with reference to FIGS. 9 and 10. It will also be clearly recognized in the art how the methods described herein can be used to phase couple the multiple emitters in such a laser array, as for example by adjusting the widths and separations of the current confining implants or by changing the shape and arrangement of the implants to create Y-coupled gain guides.

Substrate 11 is typically composed of n-GaAs with a thickness of about 70–100 microns. Lower cladding layer 13 is typically composed of n-Ga$_{1-x}$Al$_x$As, where x is usually in the range from 0.3 to 0.8, with a doping level in a range from $10^{17}$ to $10^{19}$cm$^{-3}$(Se or other n-type dopant) which may vary with distance from layer 15 and a thickness generally greater than 1.0 micron. Active region 15 is defined by one or more layers which may or may not be intentionally doped.

For example, a single 0.5 micron thick layer of $Ga_{1-y}Al_yAs$, where y is less than the Al content of layers 13 and 17, may define an active region 15. Preferably, however, a plurality of thin layers in a single-, double- or triple-quantum well separate-confinement-heterostructure or multiple-quantum well heterostructure define active region 15. Such a quantum well structure might consist of four 50 to 150 Å thick quantum wells of GaAs alternating with three 30 to 150 Å thick barriers of $Ga_{0.8}Al_{0.2}As$. Upper cladding layer 17 is typically composed of $p-Ga_{1-z}Al_zAs$, where z is in the range from 0.3 to 0.8, with a doping level in a range from $10^{17}$ to $10^{19} cm^{-3}$(Mg, Zn, or other p-dopant) which may vary with distance from layer 15 and a thickness typically in a range from 1.0 to 1.5 microns. Again, the thickness of the cladding layers need not be constant, but rather may vary depending on the type of lateral waveguide structure to be formed, if any. Cap layer 21 is typically composed of p-GaAs, with a doping level of about $10^{19} cm^{-3}$(Zn) and a thickness in a range from about 0.3 to 0.5 microns.

The composition, dopants, doping levels and dimensions given above are exemplary only and variations in these parameters are permissible. Instead of GaAs and GaAlAs, other light emitting semiconductor materials, such as GaAlSb, InP, InGaAsP, other III-V alloys, II-VI alloys and IV-VI alloys, may be used. The layers are doped to provide a rectifying p-n junction adjacent to the active region 15. While substrate 11 and lower cladding layer 13 are usually n-type conductivity and upper cladding layer 17 and cap layer 19 are usually p-type conductivity, the conductivity types may be reversed. Additionally, other layers from the ones shown may also be included. Essentially, the starting semiconductor material laser structure that is formed includes a first plurality of adjacent material layers of a first conductivity type, a second plurality of adjacent material layers of a second conductivity type, and at least one layer between the first and second pluralities of layers defining an active region.

With reference to FIG. 2, the laser structure of FIG. 1 is subjected to an implantation step followed by an anneal step. A mask 21 of $Si_3N_4$, silica, aluminum or other suitable material is formed on top of cap layer 19. Using conventional photolithographic steps, selected portions of the mask 21 are removed to define openings through which implantation is to take place. Next, impurity ions of n-type conductivity are implanted through the surface into selected regions of p-type upper cladding layer 17. Suitable n-type impurities include Si, Sn, S, Se and Te. If upper cladding layer 17 is n-type instead of p-type, i.e. where the conductivity types are reversed from those described above, p-type impurity ions are implanted. Suitable p-type impurities include Be, Mg, Zn and Cd. Typically implantation energies range from 200 keV to 500 keV or more. A high dose in the range from $10^{18}$ to $10^{19}/cm^3$ is used so that the resulting peak concentration of implanted impurities exceeds the original dopant concentration of $10^{17}$ to $10^{18}/cm^3$ prior to implantation, thereby converting "buried" implant regions in the cladding layer to the opposite conductivity type. Thus, n-type buried regions are formed at a predetermined depth in the p-type cladding layer 17, or alternatively p-type buried regions are formed in an n-type cladding layer.

The impurity ions may also be implanted in multiple doses with different implantation energies in order to create more than one level of buried regions. For example, a first implantation may be made using one ion beam acceleration potential to give the ions an energy of about 500 keV or so. Then a second implantation may be made using a lower acceleration potential to give the ions an energy of only about 200 keV. This forms two buried layers characterized by greater current blocking than a single buried layer. Multiple implants are typically done with the same ion species at each implantation energy. However, more than one ion species may be implanted if desired.

After impurity implantation, the laser structure is thermally annealed to correct damage to the crystal lattice caused by the implantation process, and to cause the impurity ions to move into lattice sites and become electrically active. Annealing temperatures for dopants implanted into GaAs and GaAlAs vary from impurity to impurity, but fall generally within the range from 600° C. to 900° C. Beryllium, for example, is activated by annealing the wafer at 675° C. for 2 seconds. Impurity atoms with higher atomic weights will cause more implantation damage and will accordingly require annealing at higher temperatures, longer time periods up to 30 minutes or both. Because GaAs begins to dissociate by 350° C. with significant arsenic loss by 600° C., annealing is usually carried out with a silicon nitride, aluminum oxide or aluminum oxynitride surface cap and in a pressurized arsenic vapor environment. A rapid anneal, such as an anneal time of 10 minutes or less, is preferred to minimize diffusion of the implanted impurities. Diffusion of beryllium in the 2 seconds it takes to activate the implant is insignificant. If implantation occurs at elevated temperatures of 250° C. to 350° C., some self-annealing will occur during implantation, reducing the time needed in the subsequent anneal stage.

With reference to FIG. 3, the resulting laser structure has buried regions 25 and 26 characterized by an impurity concentration profile that has a peak concentration near an average depth of about 1.0 micron and falls off for greater and lesser depths. The upper and lower "boundaries" of the buried regions 25 and 26, shown as dashed lines, occur where the implanted impurity concentration is equal to the unimplanted impurity concentration of cladding layer 17. The combination cladding layer/buried implant structure is a p-n-p (or alternatively an n-p-n) transistor which blocks current due to the reversed biased p-n junction. Current I is allowed to flow only through the channel 27 defined between the buried regions 25 and 26, and the resulting light emitting region 29 in the active region 15 is correspondingly confined.

With reference to FIG. 4, in an alternative method, implantation is done through substrate 11 of the laser structure in FIG. 1, instead of through the cap layer 19, followed by annealing. A p-type impurity is used for n-type substrates, while an n-type impurity is used for p-type substrates. Because the impurity penetration is generally at most two or three microns while the substrate 11 is typically 70-100 microns thick, the buried regions 35 and 36 form near the bottom of the laser structure, relatively distant from the active region 15. To compensate for current spreading, the channel 37 between buried regions 35 and 36 must be made narrower than the desired width of the light emitting region 29. Alternatively, implantation can be made through the top of substrate 11 prior to the growth of layers 13, 15, 17 and 19.

With reference to FIG. 5, the preferred method begins by forming the laser structure in FIG. 1 then follows with a diffusion step. A protective mask layer 39 of Si$_3$N$_4$ or other suitable material is formed on cap layer 19 then selectively removed, using conventional photolithography steps, from surface areas where diffusion is to take place. A layer 41 of a disorder inducing impurity, such as silicon or zinc, is deposited over mask 39 and exposed areas of cap 19. And another layer 43 of Si$_3$N$_4$ deposited over the silicon layer 41. Next, the silicon is driven into the semiconductor layers 17 and 19 from the surface and diffused. Diffusion may be produced by annealing the wafer at an elevated temperature for a predetermined period of time. Each impurity has its own diffusion rate. Silicon driven at a temperature of 850° C. for about 10 hours will diffuse from the surface through the active region 15 to a concentration level of about $3 \times 10^{18}$cm$^{-3}$. Zinc driven at a temperature of 600° C. diffuses a similar amount in about 3 hours. This diffusion time results in a complete smearing of the active region 15 in areas where the diffusing impurities pass. Shorter time periods or low temperatures will only partially disorder the active region 15, leaving a transparent transverse waveguide. Complete disordering is desired when impurity induced disordering is used to produce a lateral waveguide structure, as seen in FIG. 6, while partial disordering is desired to produce transparent windows with waveguides on the ends adjacent to the laser's reflective mirror facets.

With reference to FIG. 6, after diffusion the laser structure has side regions 47 and 49 bounding the remaining portion of active region 15. In the case of a laser array, diffused regions like regions 47 and 49 separate plural portions of active region 15. The diffusing silicon converts the semiconductor material of portions of layers 19, 17 and 15 into n-type material. Accordingly, side regions 47 and 49 are n-type regions. Remaining portions of layers 19 and 17 are still p-type. If the conductivity type of the starting material in FIG. 1 is reversed, then p-type zinc diffusion results in p-type side regions 47 and 49, while layers 17 and 19 remain n-type.

It has been discovered that if a saturable absorber is introduced into areas which overlap with the optical mode of light propagating in active region 15, the output wavelength is stabilized. This happens because the standing wave that forms in the resonant optical cavity of the laser saturates the absorption where the intensity is peaked and leaves residual absorption where the intensity is nulled. For the laser to excite a different longitudinal mode, the unsaturated loss must first be overcome before a different standing wave pattern can be set up. The interaction of saturable absorbers with the evanescent tails of the optical mode is sufficient to stabilize the spectral output. The silicon introduced by diffusion in FIG. 5 is a saturable absorber. An overlap of 1.0 to 1.5 percent of the side regions 47 and 49 in FIG. 6 with the evanescent tails of the optical mode is sufficient to stabilize the output. Similar effects would result in the embodiments of FIGS. 3 and 4 by the introduction of absorption centers into lateral waveguide regions to the sides of light emitting regions 29. The absorption centers, such as rare earth impurities or high doping concentrations, can be introduced by diffusion, implantation or inclusion during epitaxial growth of the structure in FIG. 1.

Referring again to FIG. 6, implantation and anneal steps follow diffusion. Impurity ions 51 are implanted in the same manner as in FIGS. 2 and 4 with the exceptions that implantation is uniform instead of to selected regions, so that no mask is required, and the conductivity type is reversed. In other words, when upper cladding layer 17 is n-type conductivity, an n-type impurity ion is implanted, while when upper cladding layer 17 is p-type conductivity, a p-type impurity ion is implanted. Because diffused side regions 47 and 49 have the opposite conductivity, a current blocking reverse bias junction is set up in the side regions 47 and 49 while the current path in the central regions 17 and 19 is unaffected. As in FIG. 2, the impurity ions can also be implanted in multiple doses with different implantation energies to create more than one level of buried regions.

In FIG. 7, the laser resulting from the growth, diffusion, implantation and anneal steps of FIGS. 1, 5 and 6 comprises a first plurality of adjacent semiconductor material layers of a first conductivity type, namely substrate 11 and lower cladding layer 13 of n-type (alternatively, p-type) conductivity, an active region 15 defined by either a single semiconductor material layer or a plurality of thin layers in a quantum well structure disposed on the lower cladding layer 13, and a second plurality of adjacent semiconductor material layers disposed on active region 15. namely layers 17, 19, 47, 49 and 53. This second plurality of semiconductor layers includes a central region made up of a plurality of layers of a second conductivity type, namely upper cladding layer 17 and cap layer 19 of p-type (alternatively, n-type) conductivity, bounded between side regions 47 and 49 of the first conductivity type, i.e. n-type (alternatively p-type) conductivity. The second plurality of layers also includes a buried implant region 53 at some uniform average depth between the active region and the top surface of cap 19 and crossing through side regions 47 and 49.

With reference to FIG. 8, the buried implant region 53 is characterized by a concentration distribution profile 57 of the second conductivity type, i.e. p-type (alternatively, n-type). Profile 57 has a peak concentration at a point 63 that is greater than the concentration 55 of first conductivity type impurities in the side regions 47 and 49, represented in the portion of the laser structure on the left side of FIG. 8 by portions 47a and 47b of side region 47. For example, line 55 in the graph on the right side of FIG. 8 indicates a concentration of $10^{17}$ n-type impurity atoms/cm$^3$, resulting from the diffusion step of FIG. 5. The concentration profile 57 of p-type impurity atoms resulting from the implantation step of FIG. 6 has a peak concentration at point 63 of $10^{18}$/cm$^3$. The boundaries 54 of buried region 53 correspond to points 59 and 61 in the graph where the concentrations of n-type and p-type impurities are equal. Within buried region 53 the concentration of n-type impurities exceeds the concentration of p-type impurities, while the reverse is true outside of buried region 53 in side region portions 47a and 47b.

The implant concentration profile 57 differs from that obtained by layer growth in that the profile is graded rather than abrupt at the boundaries 54. While the profile is approximately Gaussian in nature, having a peak concentration 63 at or proximate to the average implantation depth and a concentration that falls off gradually for greater or lesser depths, its exact dependence is determined by many factors. These include the implantation range, including the known effects of channeling, and nuclear and electronic stopping during the implantation step, and the effect of diffusion during the annealing step.

Returning to FIG. 7, once all of the above described steps are completed the wafer is cleaved into individual laser diodes or diode laser arrays. Cleavage produces rear and front facets 65 and 67 for providing reflective feedback of light generated within the laser's active region, and thereby establishes a resonant optical cavity for the production of a coherent light output. Facets 65 and 67 may be coated if desired to adjust their reflectivities. The lasers or laser arrays are provided with conductive contact layers 69 and 71 on the top cap layer 19 and the bottom surfaced substrate 11. Contact layers 69 and 71 provide a metallization for electrode connection to forward bias the laser and inject current I into the laser. Contact layers 69 and 71 are typically composed of a Ti/Pt/Au alloy and an Au/Ge alloy, respectively. Injected current I flows through p-type layers 19, 17 and 53 through active region 15, then through n-type layers 13 and 11. Current is blocked from flowing through n-type side regions 47 and 49 by the reverse bias junction provided by the p-type current blocking implant region 53. Accordingly, light is generated only in the central area 73 through which current I flows.

The laser diodes made by the methods described above may be individual lasers with just a single emitter, as shown for example in FIG. 7, or alternatively, may be laser arrays with a plurality of emitters monolithically integrated on a common substrate. Whether with just a single emitter or a plurality of emitters, the metallization contact layers, such as layers 69 and 71 in FIG. 7, could be continuous sheets electrically communicating with each emitter. In that case, the current would be substantially same through each emitter's active region 15 and the emitters would not be individually addressable. Alternatively, one of the contact layers could be in the form of multiple strips, one strip for each emitter. In this case, the current injected through each emitter's active region could be separately controlled, a different current being addressed to each emitter. One way of forming such an individually addressable laser diode array is depicted in FIGS. 9 and 10.

FIG. 9 continues the process shown in FIG. 6. After implantation and annealing steps have formed the buried implant region 53 through upper cladding layer 17 and side regions 47, 49, 50, 52, etc. a mask 54 is disposed on top of the laser structure and photolithographically defined. Like the mask 21 in FIG. 2, mask 54 can be Si$_3$N$_4$, silica, aluminum, photoresist or some other suitable material. An insulative surface implant is made following mask definition. Lattice damaging ions 56, such as protons (H$^+$) or oxygen ions, are made to bombard the surface with implantation energies on the order of 1 MeV so as to create semi-insulative regions 68 in areas not protected by mask 54. Regions 68 are located in side areas 47, 49, 50, 52 etc. After implantation, mask 54 is removed.

In FIG. 10 the laser array resulting from growth, diffusion, implantation and anneal, and surface implantation steps of FIGS. 1, 5, 6 and 9 comprises a first plurality of adjacent semiconductor material layers of a first conductivity type, namely substrate 11 and lower cladding layer 13 of n-type conductivity, a plurality of active regions 15, each defined by either a single semiconductor material layer or a plurality of thin layers in a quantum well structure, disposed on lower cladding layer 13, and a second plurality of adjacent semiconductor layers disposed on active regions 15, namely layers or regions 17, 19, 47, 49, 50, 52, 53 and 68. This second plurality of semiconductor layers includes a plurality of emitter regions, each made up of a plurality of semiconductor layers of a second conductivity type, namely upper cladding layers 17 and cap layers 19 of p-type conductivity, bounded by side regions 47, 49, 50, 52, etc. of the first conductivity type (n-type) conductivity. The second plurality of semiconductor layers also includes the second conductivity type (p-type) buried implant region 53 at a uniform average depth between the active regions 15 and the top surface of cap layers 19 and crossing through cap layers 17 and side regions 47, 49, 50, 52, etc. Finally, the second plurality of semiconductor layers includes ion bombarded surface regions 68 that are electrically insulating in character disposed all or substantially in the side regions. The wafer is cleaved into diode laser arrays with front and rear facets, like facets 65 and 67 in FIG. 7, for providing reflective feedback of light generated in the active regions 15 to thereby establish a resonant laser cavity.

The laser array is provided with metallic contacts 69 and 71. Contact 71 is a layer disposed on the bottom surface of substrate 11. Contacts 69 are spaced apart strips disposed on the top surface of cap layers 19. Contact layers 69 and 71 are typically composed of a Ti/Pt/Au alloy and an Au/Ge alloy, respectively. Contacts 69 and 71 provide the metallization for electrode connection to forward bias the laser array and inject current into the several laser emitters of the array. Injected currents $I_1$, $I_2$, $I_3$, $I_4$, etc. flow through the p-type layers 19, 17 and 53, through active regions 15, then through n-type layers 13 and 11. Current is blocked from flowing through n-type side regions 47, 49, 50, 52, etc. by the reverse bias junction provided by the p-type current blocking buried implant region 53. Current is also blocked from flowing in the array surface regions between contacts 69 by the insulative regions 68. Thus each contact 69 can be addressed individually with a different bias voltage and different currents $I_1$, $I_2$, $I_3$, $I_4$, etc. can be injected into the different emitters' active regions 15. Light 73 generated by each emitter can thus be controlled separately from the others.

The methods described above may be extended to the formation of buried doped layers in any semiconductor material structure, not just laser structures. Referring again to FIGS. 1-3, the semiconductor structure in FIG. 1 includes material layers 17 and 19 of a first conductivity type. In FIG. 1, impurity ions 23 are implanted through the surface above layer 19 into selected regions of layer 17 defined by mask 21. The impurity ions 23, which are of a second conductivity type are implanted to a predetermined average depth, depending on the implantation energy, ion type and semiconductor layer material, and form buried regions 25, in FIG. 3, of the second conductivity type within the selected regions of layer 17. Preferably, the structure in FIG. 3 is thermally annealed following the implantation.

The particular semiconductor structure, shown in FIG. 1, is a laser structure formed with an active lasing region 15 therein, and the buried regions 25 in FIG. 3 resulting from the method define current conductive channels 27 therebetween which allows electric current to flow only through channels 27 to the active region 15. However, the active lasing region 15 is not essential to the method and the buried regions 25 with channels 27 between them will still block current flow and allow flow only through channels 27 even in the absence of an active lasing region. As with the laser structure, the ion implantation into other semiconductor structures is typically in a range from 200 keV to 500 keV energy to a peak impurity concentration in the buried regions of at least $10^{18}/cm^3$.

With reference to FIG. 11, a semiconductor material structure includes a first conductivity type material 75. Regions 77 and 79 of a second conductivity type are formed in material 75 and are sufficiently spaced apart to be electrically isolated from one another, the material 75 being in effect substantially nonconducting of charge carried from one region 77 to the other 79. Impurity ions of the second conductivity type are implanted through the surface of the structure into selected regions of material 75 between regions 77 and 79. The ions are implanted to a predetermined average depth so as to form a buried channel region 81 of the second conductivity type electrically connecting regions 77 and 79 together. In operation, an electric potential applied to regions 77 will cause current I to flow from region 77 through channel region 81 to region 79.

With reference to FIG. 12, the semiconductor material structure includes a first conductivity type material 83 disposed atop a second conductivity type material 85. Impurity ions of the second conductivity type are implanted through the surface of the structure to a predetermined average depth into material 83. This implantation forms a buried layer 87 of the second conductivity type. The resulting structure is a pnpn-type switch. As the bias potential applied between material layers 83 and 85 increases, the tunneling current I across the potential barrier created by buried layer 87, which at low bias voltages is negligible, also increases, effectively switching the structure on.

With reference to FIG. 13, a semiconductor material structure includes a material 89 of a first conductivity type. A region 91 of a second conductivity type is formed in the surface of first conductivity material 89, and an impurity of the second conductivity type is implanted to a predetermined average depth in selected regions of material 89 so as to form a buried base region 93 connecting to region 91. The resulting structure is a bipolar transistor in which the buried region 93 forms the base and first conductivity material 89 is separated by base region 93 into a collector 89a and an emitter 89b. Region 91 allows the base 93 to be connected to a lead 95. Leads 97 and 99 may connect to collector 89a and emitter 89b, respectively, completing the device.

We claim:

1. A semiconductor laser comprising:
    a first plurality of adjacent semiconductor material layers of a first conductivity type,
    an active lasing region defined by at least one semiconductor material layer disposed on said first plurality of layers,
    a second plurality of adjacent semiconductor material layers disposed on said active region, said second plurality of layers including a plurality of semiconductor layers of a second conductivity type between side regions of said first conductivity type, said side regions of said first conductivity type having buried implant regions therein, said buried implants being characterized by a concentration distribution profile of a second conducting type impurity with a peak concentration greater than a concentration of first conductivity type impurities in said side regions, whereby said buried implant regions are of second conductivity type blocking current through said side regions, and
    resonant cavity means disposed relative to opposed ends of said active region for providing feedback of light generated in said active lasing region.

2. The laser of claim 1 wherein said buried implants in said side regions are defined by a single implant region uniformly extending across both said side regions and one of said plurality of semiconductor layers of said second conductivity type between said side regions.

3. The laser of claim 1 wherein there are more than one buried implant regions at different levels in their said side regions.

4. The laser of claim 1 wherein said side regions have a disorder inducing impurity present therein.

5. The laser of claim 1 wherein said side regions contain a saturable absorber.

6. The laser of claim 1 further comprising transparent window regions disposed at opposed ends of said active region adjacent to said resonant cavity means, said window regions including waveguides extending from said active region to said resonant cavity means.

7. The laser of claim 1 wherein said resonant cavity means comprise front and rear facets.

8. The laser of claim 1 wherein said peak concentration of said second conductivity type impurity in said buried implant regions is at least $10^{18}/cm^3$.

9. The laser of claim 1 wherein there are at least three said side regions bounding a plurality of emitter regions therebetween of said second conductivity type providing current paths through laterally spaced apart portions of said active lasing region.

10. The laser of claim 9 wherein a plurality of individually addressable spaced apart conductive contacts are disposed on top of said emitter regions, said side regions including insulative surface regions.

11. The laser of claim 1 wherein said first conductivity type is n-type conductivity and said second conductivity type is p-type conductivity, said second conductivity type impurity in said buried implant regions being selected from the group consisting of Be, Mg, Zn and Cd ions.

12. The laser of claim 1 wherein said first conductivity type is p-type conductivity and said second conductivity type is n-type conductivity, said second conductivity type impurity in said buried implant regions is selected from the group consisting of Si, Sn, S, Se and Te ions.

13. A semiconductor laser comprising
    a first plurality of adjacent semiconductor material layers of a first conductivity type,
    an active lasing region defined by at least one semiconductor material layer disposed on said first plurality of layers,
    a second plurality of adjacent semiconductor material layers disposed on said active region, said second plurality of layers including a plurality of semiconductor layers of a second conductivity type and a plurality of laterally spaced apart buried implant regions therein, each of said buried implants being characterized by a concentration distribution profile of a first conductivity type impurity with a peak concentration greater than a concentration of second conductivity type impurities in that layer of said second plurality in which said buried implant is situated, whereby said buried implant regions are of first conductivity type, so as to block current therethrough with channels for current flow being defined between said spaced apart buried implant regions, and resonant cavity means disposed relative to opposite ends of said active region for providing feedback of light generated in said active lasing region.

14. The laser of claim 13 wherein a layer interface between at least one pair of adjacent semiconductor material layers is nonplanar such that real refractive index lateral waveguide structures are defined in said layers.

15. The laser of claim 14 wherein said lateral waveguide structures have absorption centers disposed in said semiconductor material layers in regions overlapping evanescent tails of an optical field of light generated in said active lasing region.

16. The laser of claim 13 wherein said buried implant regions are located in a substrate layer of said second plurality of layers.

17. The laser of claim 13 further comprising additional laterally spaced apart buried implant regions in said second plurality of layers at a different level from the first buried implant regions.

18. The laser of claim 13 wherein said peak concentration of said first conductivity type impurities in said buried implant regions is at least $10^{18} cm^3$.

19. The laser of claim 13 wherein said first conductivity type is p-type conductivity and said second conductivity type is n-type conductivity, said first conductivity type impurity in buried implant regions being selected from the group consisting of Be, Mg, Zn and Cd ions.

20. The laser of claim 13 wherein said first conductivity type is n-type conductivity and said second conductivity type is p-type conductivity, said first conductivity type impurity in said buried implant regions being selected from the group consisting of Si, Sn, S, Se and Te ions.

21. The laser of claim 13 wherein there are at least three laterally spaced apart buried implant regions bounding a plurality of channels for current flow therebetween, thereby defining a plurality of laterally spaced apart laser emitters corresponding to the active lasing region beneath said channels.

22. An individually addressable semiconductor laser array comprising:

a first plurality of adjacent semiconductor material layers of a first conductivity type, an active lasing region defined by at least one semiconductor material layer disposed on said first plurality of layers, a second plurality of adjacent semiconductor material layers disposed on said active region, said second plurality of layers including multiple emitter regions with a plurality of semiconductor layers of a second conductivity type between three or more side regions of said first conductivity type, said side regions of said first conductivity type having buried implant regions therein, said buried implants being characterized by a concentration distribution profile of a second conducting type impurity with a peak concentration greater than a concentration of first conductivity type impurities in said side regions, whereby said buried implant regions are of second conductivity type blocking current through said side regions, said side regions also having insulative regions therein at a top surface of said second plurality of layers, resonant cavity means disposed relative to opposed ends of said active region for providing feedback of light generated in said active lasing region, and conductive contacts disposed under said first plurality of layers and on top of said second plurality of layers, said top contacts being disposed over said multiple emitter regions with said insulative regions located between said contacts.

* * * * *